(12) United States Patent
Miesner (10) Patent No.: US 10,175,306 B1
(45) Date of Patent: Jan. 8, 2019

(54) LARGE AREA MAGNETIC FLUX SENSOR

(71) Applicant: John E. Miesner, Fairfax, VA (US)

(72) Inventor: John E. Miesner, Fairfax, VA (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 102 days.

(21) Appl. No.: 15/366,330

(22) Filed: Dec. 1, 2016

(51) Int. Cl.
*G01R 33/02* (2006.01)
*G01R 33/028* (2006.01)

(52) U.S. Cl.
CPC .................. *G01R 33/028* (2013.01)

(58) Field of Classification Search
CPC .............. G01R 33/028; G01R 33/0283; G01R 33/0286; G01R 33/0385; G01R 15/148; G01R 15/20; G01N 27/9033; G01N 27/902; G01N 27/9013; G01N 27/904; G01N 27/223; G01N 27/82; G01N 27/9093
See application file for complete search history.

(56) References Cited

U.S. PATENT DOCUMENTS

| | | | |
|---|---|---|---|
| 6,426,621 B1 | 7/2002 | Chen | |
| 6,975,109 B2 * | 12/2005 | Chen | G01R 33/02 324/244 |
| 7,642,692 B1 * | 1/2010 | Pulskamp | G01R 33/028 310/309 |
| 2003/0020472 A1 * | 1/2003 | Kretschmann | G01R 33/028 324/259 |
| 2005/0127785 A1 * | 6/2005 | Zeighami | G01R 15/148 310/328 |
| 2005/0248340 A1 * | 11/2005 | Berkcan | G01R 33/0283 324/259 |
| 2009/0033314 A1 * | 2/2009 | Berkcan | G01R 15/148 324/117 R |
| 2012/0139389 A1 * | 6/2012 | Bohringer | H02N 2/186 310/300 |

* cited by examiner

Primary Examiner — Thang Le
(74) Attorney, Agent, or Firm — Howard Kaiser (57) ABSTRACT

An exemplary magnetic flux sensor in accordance with the present invention is characterized by an electrical output that is proportional to the total static and dynamic flux passing normally through a large area. An oscillating electrical current passing down a conducting area produces Lorentz forces, which are transferred to piezoelectric areas. The piezoelectric areas produce electrical voltage at the oscillation frequency whereby amplitude is proportional to the total magnetic flux passing normally through the conducting area. Demodulating the voltage provides an electrical signal with high sensitivity, dynamic range, and noise immunity.

23 Claims, 5 Drawing Sheets

LARGE AREA MAGNETIC FLUX SENSOR

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to magnetic flux sensors, more particularly to magnetic flux sensors suitable for sensing magnetic flux through relatively large areas.

There currently exists no practical method to measure the total static and dynamic magnetic flux passing normally through a large area. Semiconductor Hall devices are commonly used in magnetic machines, but they are small and essentially sample a single point. Magnetoresistive devices are becoming more practical; however, they are small and they sense flux down the device axis and not though the sensor thickness.

Many devices would benefit from a large area magnetic flux sensor. For example, an electrodynamic actuator produces forces proportional to the current through the coil conductors and the total flux perpendicular to the coil surface. Typically the coil is designed to be wider than optimum to keep the flux within the area of the coil as it moves, and to thereby reduce force dependence on position. If the total flux perpendicular to the entire coil surface were known, then the conductor current could be controlled to eliminate the force dependence on position. This would allow the coil width to be optimized for more efficient actuator operation.

U.S. Pat. No. 6,975,109 to Bo Su Chen discloses a microelectronic sensor that uses the Lorentz force and a piezoelectric effect to measure magnetic flux. A direct current is passed through a first layer, and the resulting Lorentz force causes shear in a piezoelectric second layer, which produces a voltage proportional to the magnetic flux. It should be appreciated that the device disclosed by Chen is not capable of continuously measuring a static or slowly varying magnetic flux. A statically induced piezoelectric voltage will dissipate with time, and stray electrical charge noise will build up in the detection circuit and degrade the flux measurement accuracy of Chen's device. Also, the construction methods of the apparatus disclosed by Chen limits its use to a small area. Finally, Chen's device will have a low sensitivity, because piezoelectric materials have a greatly reduced voltage response to shear as compared to extension modes.

SUMMARY OF THE INVENTION

In view of the foregoing, it is an object of the present invention to provide a magnetic flux sensor that detects total normal static and dynamic flux through an arbitrarily large area. It is a further object to provide a magnetic flux sensor with high sensitivity, dynamic range, and noise immunity.

An exemplary embodiment of a magnetic flux sensing apparatus in accordance with the present invention comprises an electrically conductive member, a pair of piezoelectric members, a pair of tensioning mechanisms, and an electrical current generator. The two piezoelectric members adjoin the conductive member on opposite sides of the conductive member. The two tensioning mechanisms exert tensile stress on the respective piezoelectric members in opposite directions away from the conductive member. The electrical current generator sends current to the conductive member. The current flows through the conductive member and interacts with the present magnetic field to produce transverse forces on the piezoelectric members causing relative voltage between their top and bottom electrodes. The voltages produced are indicative of a total magnetic flux through the conductive member.

Exemplary practice of the present invention provides a magnetic flux sensor with output proportional to the total normal magnetic flux, both static and dynamic, over a large area. An exemplary magnetic flux sensor of the present invention includes a current conducting area with width W, length L, and thickness t. An oscillating current of amplitude I that is uniform across the width W flows down the length L. Lorentz force F is produced proportional to current I and total magnetic flux $\Phi$ through the area:

$$F = \Phi I$$

The oscillating force is transferred to a left electroded piezoelectric area and a right electroded piezoelectric area. Each piezoelectric area is made of a material such as poled Polyvinylidene Difluoride (PVDF). These forces cause transverse stress $S_1$ in the left and right piezoelectric areas equal to the force divided by the cross-sectional area Lt $$S_1 = \frac{F}{Lt} = \frac{\Phi I}{Lt}$$

The piezoelectric areas produce voltage on their electrodes at the oscillation frequency according to the piezoelectric effect. The output voltage for transverse stress may be calculated using the piezoelectric stress constant $g_{31}$ by $$V_{out} = g_{31} S_1 t$$

Substituting the above equation for transverse stress $S_1$ results in:

$$V_{out} = \left[\frac{I g_{31}}{L}\right] \Phi$$

Equally, in terms of the mean magnetic flux density B through the area LW:

$$V_{out} = [W I g_{31}] \overline{B}$$

Therefore, the oscillating voltages on the respective electrodes of the left and right piezoelectric areas have an amplitude that is proportional to the total magnetic flux $\Phi$ or the mean magnetic flux density $\overline{B}$ through the current conducting area.

The voltages from the left and right piezoelectric areas may be combined in a series arrangement by connecting the left and right bottom electrodes together and measuring the voltage difference between the left and right top electrodes. Alternatively, the voltages may be combined in an anti-parallel arrangement by connecting the top electrode of each side to the bottom electrode of the other side and then measuring the voltage difference between the two electrode combinations. In either case, transverse forces due to the magnetic field will produce opposite voltages on the left and right piezoelectric areas which will add and increase the measured output voltage. In contrast, most noise sources such as air currents, vertical vibration, temperature changes, etc. will produce voltages of the same polarity on the left and right piezoelectric areas and therefore will cancel without producing measured output voltage.

The large area magnetic flux sensor of the current invention is only sensitive to normal magnetic fields, because magnetic flux components in the plane of the current conducting area produce forces that are normal to the plane, resulting in the same tension changes in the both the left and right piezoelectric areas producing cancelling voltage. The present invention's magnetic flux sensor is likewise not sensitive to temperature changes, self-Lorentz forces in the conducting area, and normal mechanical vibrations, because these phenomena cause common voltage in the left and right piezoelectric areas and are therefore cancelled.

The circuit with the series or anti-parallel left- and- right piezoelectric areas is connected to a sense amplifier, which may be a voltage or a charge amplifier. The circuit also may include a resistor in parallel with the sense amplifier. The resistor acts as a high pass filter when combined with the capacitance of the piezoelectric areas. The resistor is chosen to attenuate voltage output below the oscillation frequency.

The sense amplifier passes the voltage signal to a demodulator. The demodulator output is the amplitude of the oscillating voltage from the sense amplifier, which is proportional to the normal magnetic flux $\Phi$ through the current conducting area as desired. To obtain the highest noise rejection, the demodulator is preferably a synchronous demodulator slaved to the oscillator producing the current waveform. The demodulator is effectively a very sharp filter rejecting noise at frequencies other than the oscillation frequency and providing a low noise floor.

In exemplary practice of the present invention, the frequency of current oscillation should preferably be high enough to effectively reproduce the dynamic magnetic flux. According to the Nyquist criteria, the oscillation frequency of the present invention should be at least twice the highest frequency component of the changing magnetic flux to be measured. Piezoelectric sheets, such as made of poled PVDF, may be effectively used at 20 kHz or higher providing a potential measurement bandwidth up to 10 kHz. The bandwidth may be limited by a resonance of the current conducting area mass against the stiffness of the sensing sheet. For high bandwidth operation, the mass of the current conducting area should be as low as practical.

Piezoelectric sheets, such as made of poled PVDF, provide a high dynamic range and have been response-tested over fourteen orders of magnitude. The dynamic range of the current invention is only limited by the measurement electronics and the careful prevention of noise contamination. Amplifiers with high dynamic range, in particular charge amplifiers used with capacitive devices such as piezoelectrics, are well known to those with ordinary skill in the art.

The magnetic flux sensor of the present invention may include one or more additional features to ensure high sensitivity, dynamic range, and noise immunity. By way of example, one, some, or all of the following features are possible in inventive practice: The piezoelectric areas may be shielded by conductive bars in close proximity to prevent contamination by the electromagnetic fields from the current conducting area or from other sources. There may be an enclosing conductive case that forms another layer of shielding. There may be a magnetically transparent window covering the conducting area to protect it and prevent impingement of air currents. There may be a mass-spring suspension system to isolate the sensing sheet from mechanical vibration. All cabling may be shielded to prevent induced electromagnetic noise.

BRIEF DESCRIPTION OF THE DRAWINGS

The present invention will now be described, by way of example, with reference to the accompanying drawings, wherein like numbers indicate same or similar parts or components, and wherein:

As shown in FIG. 1, the magnetic flux density contours are superimposed.

As shown in FIG. 2 and FIG. 3, each functional area is identified.

DESCRIPTION OF EXEMPLARY EMBODIMENTS OF THE INVENTION

Figure 1:
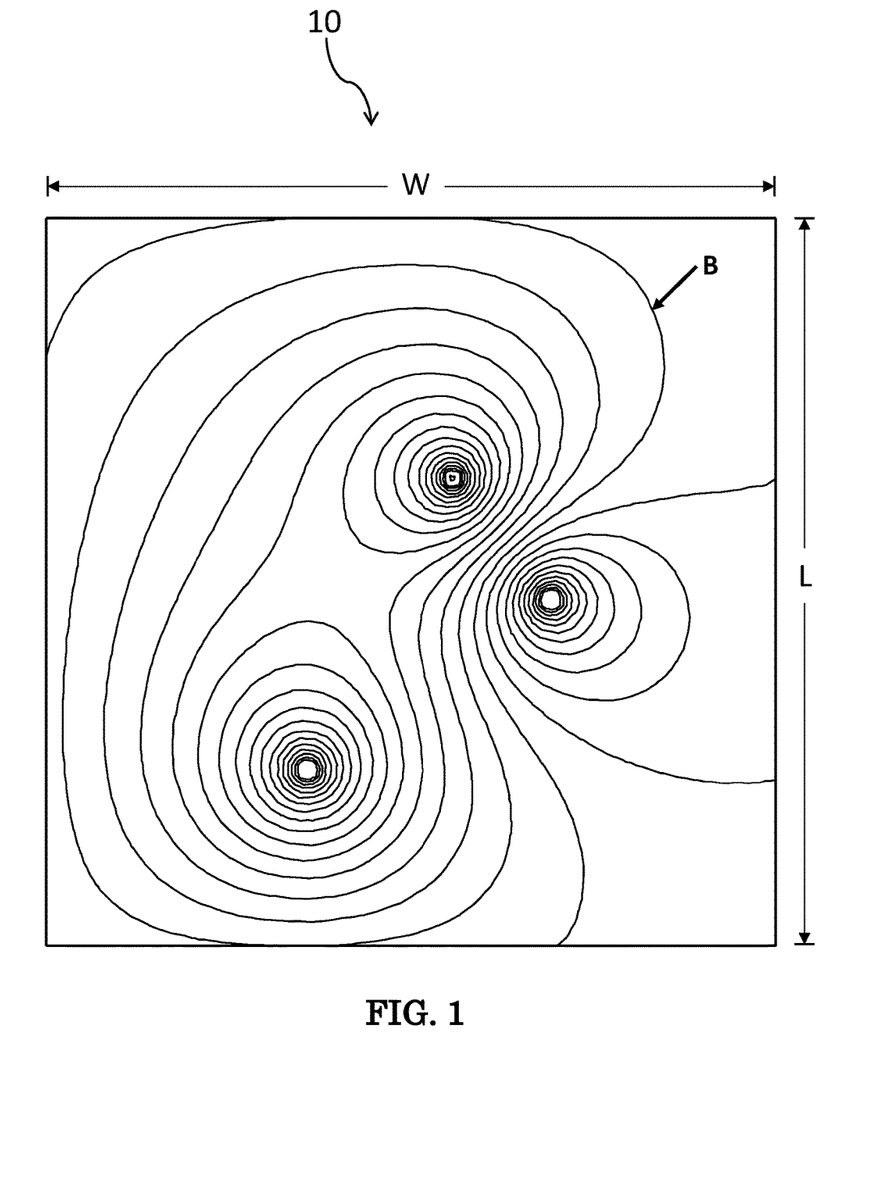
FIG. 1 illustrates an example of a possible area of interest for performing magnetic flux measurement in accordance with the present invention.

Referring now to FIG. 1, shown is an exemplary area of interest 10, characterized by width W and length L. Magnetic flux passes through this area 10, and exemplary magnetic flux density contours are shown as lines labeled B. The total normal magnetic flux $\Phi$ is equal to B integrated over the area 10. There is no known method or device to quickly and accurately measure the total normal magnetic flux $\Phi$ passing through example area 10. Conventional sensors, such as Hall sensors, would require numerous point measurements to obtain enough data to accurately integrate B over the area.

Figure 2:
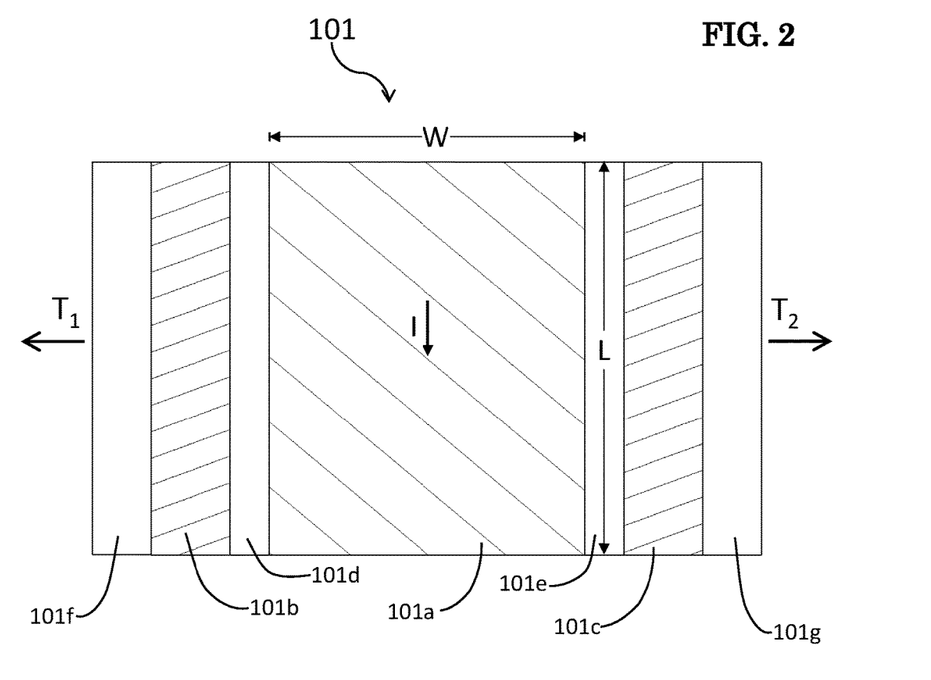
FIG. 2 is a plan view of an example of an inventive sensing sheet that may be included in a magnetic flux sensor in accordance with the present invention, such as the exemplary inventive embodiment shown in FIG. 4 and FIG. 5.
Figure 3:
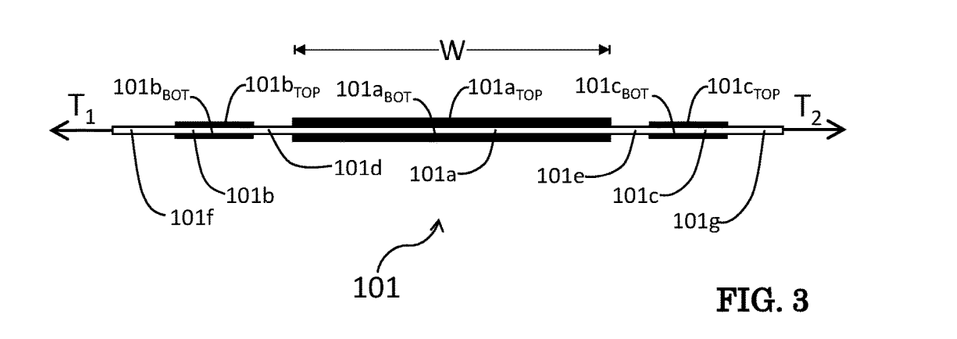
FIG. 3 is an elevation view of the exemplary inventive sensing sheet shown in FIG. 2.

An example of inventive practice is now described with reference to FIG. 2, FIG. 3, FIG. 4 and FIG. 5. FIG. 2 and FIG. 3 show an inventive sensing sheet 101 with various areas identified. Area 101a is the current conducting area; areas 101b and 101c are the piezoelectric areas; areas 101f and 101g are the attachment areas; and areas 101d and 101e are the bonding areas. Area 101a represents the area of interest 10. Current I, with a uniform current density across width W, flows down length L of current conducting area 101a. Current I interacts with magnetic flux through current conducting area 101a to produce, at each point, a Lorentz force proportional to the magnitude of the current and the magnetic flux at that point. The Lorentz forces are transverse to the direction of current flow and are transferred to piezoelectric areas 101b and 101c.

The entire sensing sheet 101 is held in transverse tension by extensional forces applied to attachment areas 101f and 101g. Transverse forces from current conducting area 101a will change the tension in piezoelectric areas 101b and 101c in opposite directions. For example, in the depiction of FIG. 2, forces to the right will increase the tension in piezoelectric area 101b and reduce the tension in piezoelectric area 101c. Piezoelectric areas 101b and 101c are electroded piezoelectric sheets.

Each of the two piezoelectric areas is contiguously sandwiched between a corresponding pair of electrodes. Piezoelectric area 101b is adjacently interposed between top electrode $101b_{TOP}$ and bottom electrode $101b_{BOT}$. Piezoelectric area 101c is adjacently interposed between top electrode $101c_{TOP}$ and bottom electrode $101c_{BOT}$. Piezoelectric areas 101b and 101c produce voltage on their respective top (upper) and bottom (lower) electrodes in response to the changes in tension from current conducting area 101a. The voltages will be in opposite directions corresponding to the opposite changes in tension. For example, if a force to the right causes piezoelectric area 101b to have a positive voltage on the upper electrode $101b_{TOP}$, then it will cause piezoelectric area 101c to have a negative voltage on the upper electrode $101c_{TOP}$.

Many methods of manufacture are available to produce sensing sheet 101 with the requisite areas and properties. For example, one could use a single sheet of poled PVDF with continuous metal film on the top and bottom surface as the starting material, and then remove the metal film from all areas except current conducting area 101a and piezoelectric areas 101b and 101c. In this case, the current flows through the top and bottom metal film of current conducting area 101a.

Alternatively, in order to make sensing sheet 101, one could start with a single sheet of PVDF and apply metal film to the top and bottom surface of current conducting area 101a and piezoelectric areas 101b and 101c only, and then pole piezoelectric areas 101b and 101c. As another approach to making sensing sheet 101, a separate material such as a thin sheet of copper or aluminum could be used for current conducting area 101a, and this material could then be attached to PVDF sheets in bonding areas 101d and 101e using heat fusing, adhesives, or mechanical means such as sewing. Other methods of producing sensing sheet 101 will be apparent to those of ordinary skill in the art who read the instant disclosure.

Figure 4:
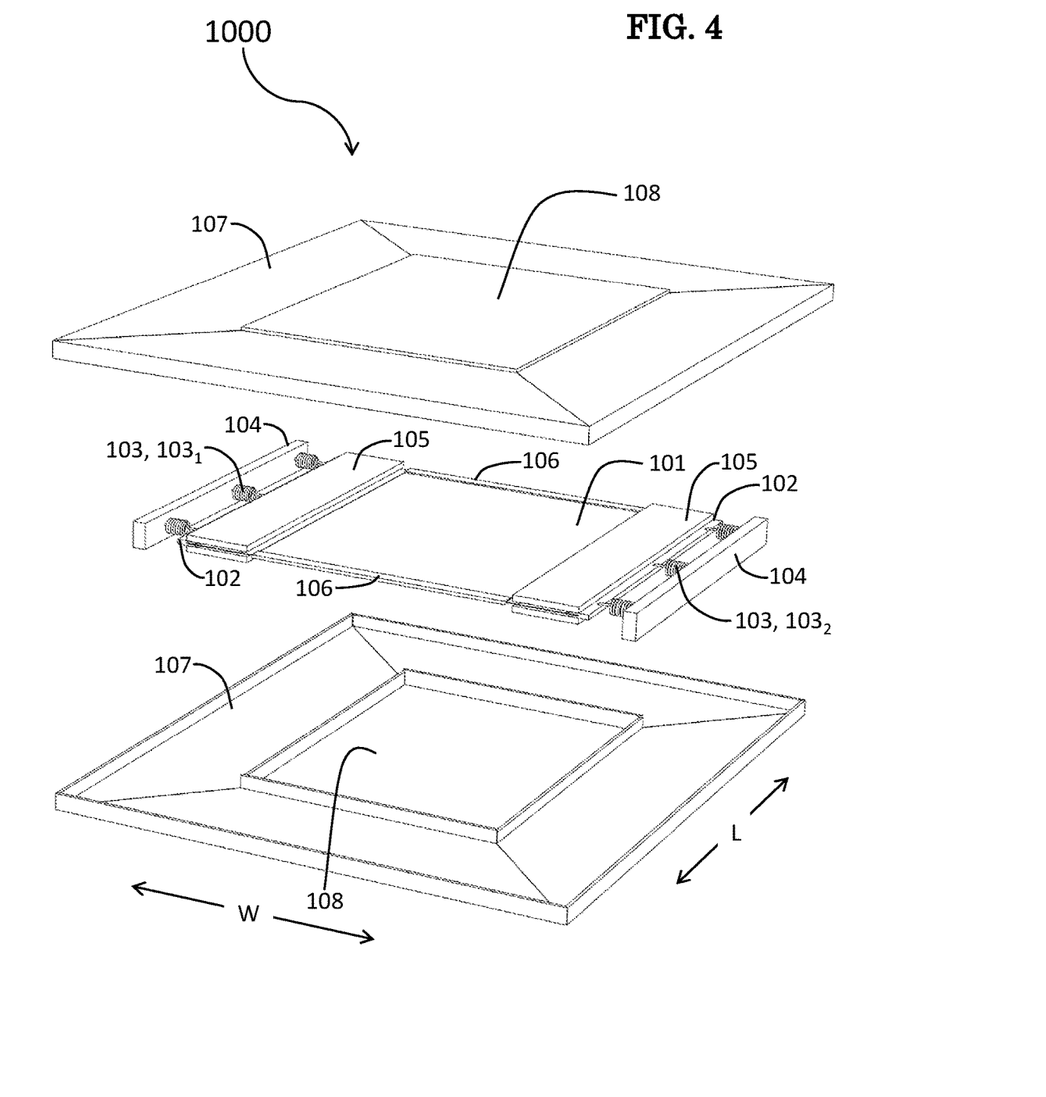
FIG. 4 is an exploded perspective view of an exemplary embodiment of a magnetic flux sensor in accordance with the present invention.
Figure 5:
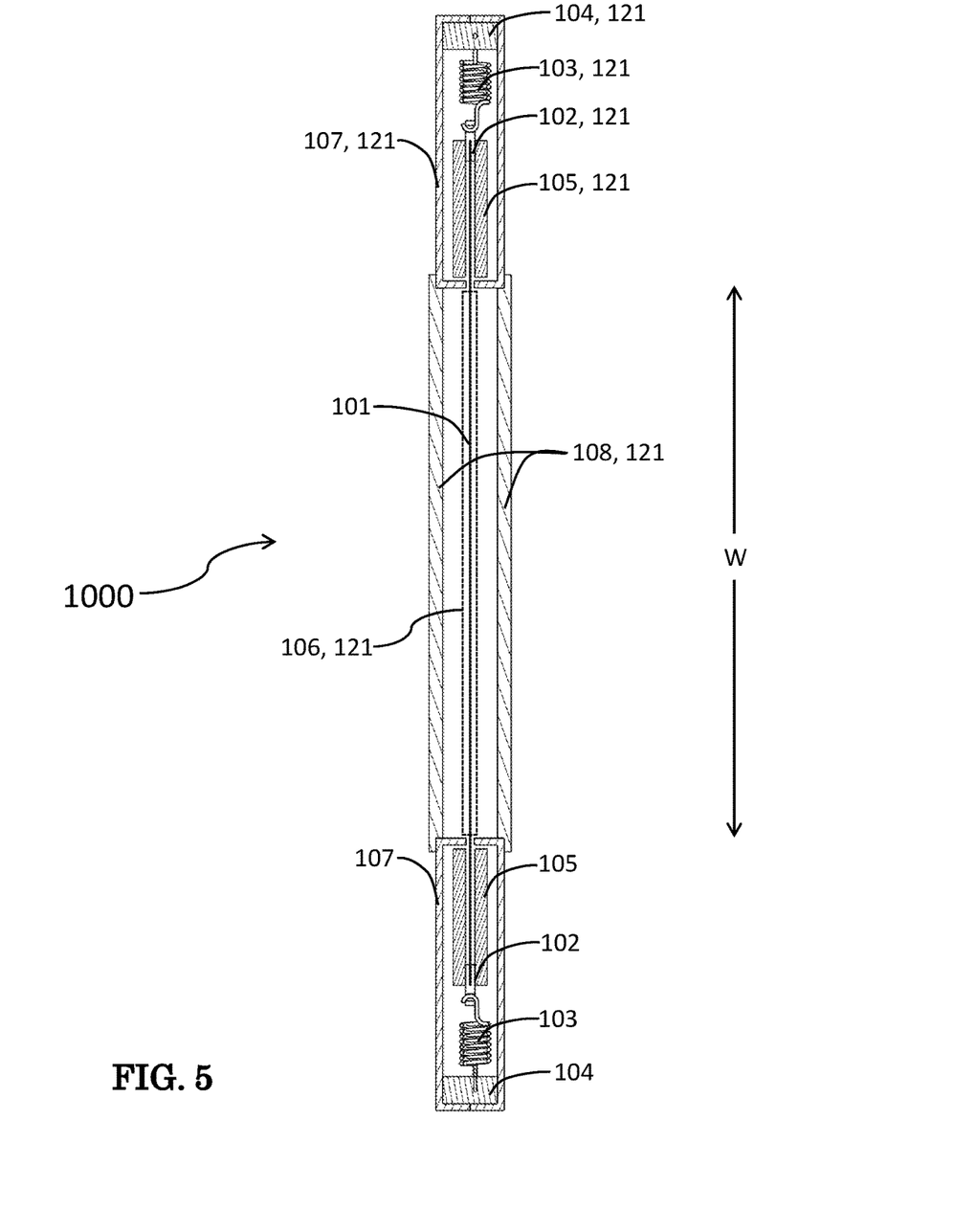
FIG. 5 is a side cross-sectional view of the exemplary inventive embodiment shown in FIG. 4.

FIG. 4 and FIG. 5 are different views showing an exemplary embodiment of a large area magnetic field sensor of the present invention. Magnetic flux sensor 1000 includes a sensing sheet 101 and a tension-producing housing 121. Thus incorporated in inventive sensor 100 is a sensing sheet 101 such as shown in FIG. 2. Housing 121 provides support, protection, mechanical isolation, and shielding for sheet 101.

Housing 121 includes attachment bars 102, springs 103, support bars 104, shields 105, current bars 106, case 107, and measurement window 108. Attachment bars 102 connect each side of sensing sheet 101 to springs 103, which apply tension from corresponding support bars 104. Tensile forces $T_1$ and $T_2$ are shown in FIG. 2 and FIG. 3. Springs $103_1$ exert tensile forces $T_1$ upon piezoelectric area 101b; springs $103_2$ exert tensile forces $T_2$ upon piezoelectric area 101c. Shields 105 above and below piezoelectric areas 101b and 101c are made of highly conductive material, such as aluminum or copper, and attenuate electromagnetic fields that could induce electrical noise in the measurement signal. Case 107 is also made of conductive material and attenuates electromagnetic fields as well as providing mechanical support to all components. Measurement window 108 is made of non-conductive material, such as Vinyl, which allows magnetic fields to pass through. Measurement window 108 protects sensing sheet 101 from contact and prevents impingement of air currents, which would contaminate the measurement signal.

The mass of attachment bars 102 and shields 105, along with the springs 103, provide a mechanical isolation system for sensing sheet 101. Vibrations in case 107 will be attenuated by this mass-spring system before passing to sensing sheet 101. The mass also provides an inertial impedance to support tension changes in piezoelectric areas 101b and 101c. As current conducting area 101a oscillates and applies forces to one side of piezoelectric areas 101b and 101c, the other side is prevented from moving by the inertial reaction of the mass of attachment bars 102 and shields 105.

Two current bars 106, both shown in FIG. 4 and one shown transparently in FIG. 5, provide current into and out of current conducting area 101a. Current bars 106 are lengthwise opposite each other, each current bar 106 situated along a widthwise edge of current conducting area 101a. The resistance of current bars 106 is very low compared to the resistance of current conducting area 101a. Therefore, the voltage is nearly uniformly across the width of current conducting area 101a, and current flows uniformly down the length.

Figure 6:
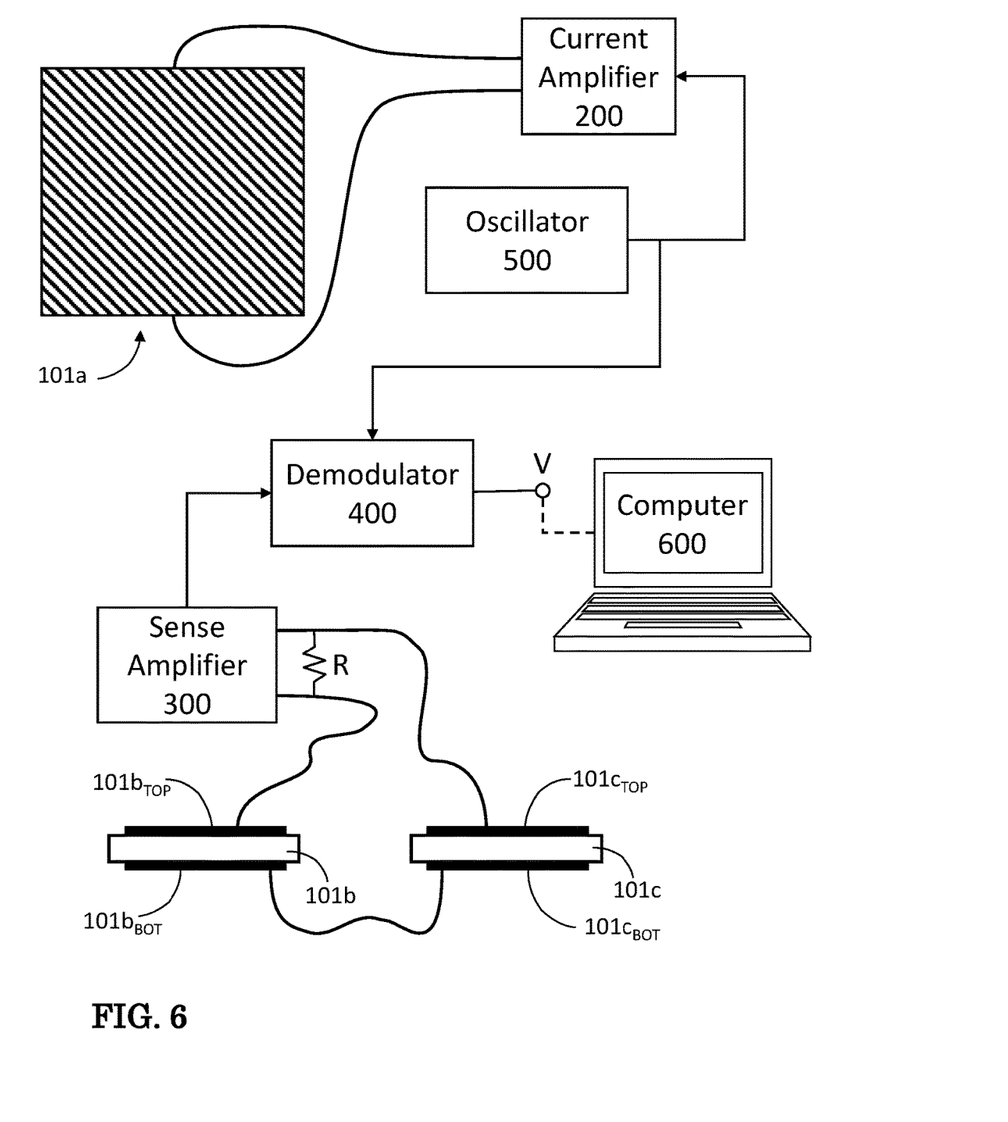
FIG. 6 is a circuitry diagram of an exemplary embodiment of a magnetic flux sensor in accordance with the present invention.

FIG. 6 illustrates exemplary circuitry of the present invention. The oscillator 500 produces a repeating waveform signal, such as a sine wave or square wave, which is passed to a current amplifier 200, which produces oscillating current that passes down the length of current conducting area 101a. The current interacts with magnetic flux passing through current conducting area 101a, and produces transverse forces on piezoelectric areas 101b and 101c, which produce voltages according to the piezoelectric effect. In this example, piezoelectric areas 101b and 101c are wired in series with bottom electrode $101b_{BOT}$ connected to bottom electrode $101c_{BOT}$ and with top electrode $101b_{TOP}$ and top electrode 101 crop producing the output so that fluctuating transverse forces produce additive voltage. Piezoelectric areas 101b and 101c could equally be wired anti-parallel with bottom electrode $101b_{BOT}$ connected to top electrode $101c_{TOP}$ and with bottom electrode $101c_{BOT}$ connected to top electrode $101b_{TOP}$ so that fluctuating transverse forces produce additive charge. For both the series and the anti-parallel connection, noise sources such as air currents, vertical vibration, temperature changes, etc. will produce voltages of the same polarity on piezoelectric areas 101b and 101c and therefore will cancel without contributing to total voltage.

The total voltage produced by the combination of piezoelectric areas 101b and 101c is amplified by the sense amplifier 300, which for exemplary inventive practice is preferably a charge amplifier. Resistor R acts as a filter when combined with the capacitance of the piezoelectric areas 101b and 101c, and attenuates low frequency signals. The sense amplifier 300 passes the voltage signal to the demodulator 400, which also receives the repeating waveform signal from the oscillator 500. The demodulator 400 produces an output voltage that is proportional to the transverse force and is therefore proportional to the total magnetic flux through the current conducting area 101a.

A computer 600 can be implemented in communication with demodulator 400. As shown in FIG. 6, computer 600 receives output voltage signals V from demodulator 400. Computer 600 processes the electrical output voltage signals V. For instance, computer 600 can apply calibration factors to output voltage signals V and display data in engineering units for the benefit of the inventive practitioner.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A magnetic flux sensing apparatus comprising:
   an electrically conductive member;
   a pair of piezoelectric members adjoining said electrically conductive member on opposite sides of said electrically conductive member;
   a pair of springs for exerting tensile stress on the respective said pair of piezoelectric members in opposite directions away from said electrically conductive member;
   an electrical current generator for sending current to said electrically conductive member, wherein said current flows through said electrically conductive member to produce voltages in the respective said pair of piezoelectric members that are indicative of a total magnetic flux through said electrically conductive member.

2. The magnetic flux sensing apparatus of claim 1, further comprising a computer for calculating said total magnetic flux based on said voltages.

3. A magnetic flux sensing device comprising:
   a sensing sheet, said sensing sheet characterized by a length and a width and including a current-conducting portion, a first piezoelectric portion, and a second piezoelectric portion, said current-conducting portion, said first piezoelectric portion, and said piezoelectric portion extending said length, said first piezoelectric portion and said second piezoelectric portion located at widthwise opposite sides of said current-conducting portion;
   at least one first spring for exerting a first tension, said first tension exerted on said first piezoelectric portion in a first widthwise direction;
   at least one second spring for exerting a second tension, said second tension exerted on said second piezoelectric portion in a second widthwise direction, said first widthwise direction and said second widthwise direction being opposite each other.

4. The magnetic flux sensing device of claim 3, further comprising:
   a first pair of electrodes, each of said first pair of electrodes including a metallic film, said first piezoelectric portion having a first top piezoelectric surface and a first bottom piezoelectric surface, said first pair of electrodes contiguously covering, respectively, said first top piezoelectric surface and said first bottom piezoelectric surface;
   a second pair of electrodes, each of said second pair of electrodes including a metallic film, said second piezoelectric portion having a second top piezoelectric surface and a second bottom piezoelectric surface, said second pair of electrodes contiguously covering, respectively, said second top piezoelectric surface and said second bottom piezoelectric surface.

5. The magnetic flux sensing device of claim 4, wherein when an oscillating current is caused to flow through said current-conducting portion in a lengthwise direction, said oscillating current produces Lorentz forces that affect said first piezoelectric portion and said second piezoelectric portion, resulting in voltages on said first pair of electrodes and said second pair of electrodes that are indicative of a total magnetic flux through said current-conducting portion.

6. The magnetic flux sensing device of claim 5, wherein said oscillating current is uniform across said width.

7. The magnetic flux sensing device of claim 5, wherein:
   the magnetic flux sensing device further comprises a casing for said sensing sheet, said at least one first spring, said at least one second spring, said first pair of electrodes, and said second pair of electrodes;
   said at least one first spring, said at least one second spring, and said case are components of a mechanical isolation system for said sensing sheet whereby vibrations in said casing are attenuated by a mass-spring system before passing to said sensing sheet.

8. The magnetic flux sensing device of claim 5, further comprising an oscillator, for producing a waveform signal.

9. The magnetic flux sensing device of claim 8, further comprising a current amplifier, for amplifying said waveform signal to produce said oscillating current.

10. The magnetic flux sensing device of claim 8, further comprising a sense amplifier, for amplifying said voltages on said first pair of electrodes and said second pair of electrodes, said amplifier producing a voltage signal.

11. The magnetic flux sensing device of claim 10, further comprising a demodulator, for:
    receiving the amplified voltage signal from said sense amplifier;
    receiving said waveform signal from said oscillator;
    producing an output voltage signal that is proportional to said total magnetic flux through said current-conducting portion.

12. The magnetic flux sensing device of claim 10, further comprising a computer for communicating with said demodulator and processing said output voltage signal.

13. A method for sensing magnetic flux, the method comprising:
    providing a sensing sheet, said sensing sheet characterized by a length and a width and including a current-conducting portion, a first piezoelectric portion, and a second piezoelectric portion, said current-conducting portion, said first piezoelectric portion, and said piezoelectric portion extending said length, said first piezoelectric portion and said second piezoelectric portion located at widthwise opposite sides of said current-conducting portion;
    exerting a first tension with respect to said sensing sheet, said exerting of said first tension including using at least one first spring, said first tension exerted on said first piezoelectric portion in a first widthwise direction;
    exerting a second tension with respect to said sensing sheet, said exerting of said second tension including using at least one second spring, said second tension exerted on said second piezoelectric portion in a second widthwise direction, said first widthwise direction and said second widthwise direction being opposite each other;
    causing an oscillating current to flow through said current-conducting portion in a lengthwise direction, wherein said oscillating current produces Lorentz forces that affect said first piezoelectric portion and said second piezoelectric portion, resulting in a first electrode voltage and a second electrode voltage, said first electrode voltage being on said first piezoelectric portion, said second electrode voltage being on said second piezoelectric portion, wherein said first electrode voltage and said second electrode voltage are indicative of a total magnetic flux through said current-conducting portion.

14. The method for sensing magnetic flux of claim 13, wherein said oscillating current is uniform across said width.

15. The method for sensing magnetic flux of claim 13, further comprising associating an outer case with said sensing sheet, said at least one first spring, and said at least one second spring, wherein said at least one first spring, said at least one second spring, and said case are components of a mechanical isolation system for said sensing sheet whereby vibrations in said outer case are attenuated by a mass-spring system before passing to said sensing sheet.

16. The method for sensing magnetic flux of claim 13, further comprising:
   producing a waveform signal;
   amplifying said waveform signal to produce said oscillating current;
   producing a voltage signal, said producing of said voltage signal including amplifying said voltages on said first pair of electrodes and said second pair of electrodes.

17. The method for sensing magnetic flux of claim 16, wherein:
   said producing of said waveform signal includes using an oscillator;
   said amplifying of said waveform signal includes using a current amplifier;
   said producing of said voltage signal includes using a sense amplifier.

18. The method for sensing magnetic flux of claim 16, further comprising producing an output voltage signal that is proportional to said total magnetic flux through said current-conducting portion, wherein said output voltage is based on said waveform signal and said voltage signal.

19. The method for sensing magnetic flux of claim 18, wherein:
   said producing of said waveform signal includes using an oscillator;
   said amplifying of said waveform signal includes using a current amplifier;
   said producing of said voltage signal includes using a sense amplifier;
   said producing of said output voltage includes using a demodulator.

20. The method for sensing magnetic flux of claim 18, further comprising using a computer for processing said output signal, wherein said computer communicates with said demodulator.

21. The method for sensing magnetic flux of claim 13, further comprising combining in a circuit said first electrode voltage and said second electrode voltage, said first electrode voltage being on said first piezoelectric portion, said second electrode voltage being on said second piezoelectric portion, said combining in said circuit being performed such that:
   transverse forces due to a magnetic field will add together and thereby increase a total voltage; and
   noise sources will cancel together and thereby not increase said total voltage.

22. The method for sensing magnetic flux of claim 21, wherein said circuit is a series circuit.

23. The method for sensing magnetic flux of claim 21, wherein said circuit is an anti-parallel circuit.

* * * * *